United States Patent
Ziegler et al.

(10) Patent No.: US 11,671,185 B2
(45) Date of Patent: Jun. 6, 2023

(54) MAIN MEASUREMENT DEVICE, SECONDARY MEASUREMENT DEVICE, MEASUREMENT SYSTEM AND METHOD

(71) Applicant: Rohde & Schwarz GmbH & Co. KG, Munich (DE)

(72) Inventors: Andreas Ziegler, Munich (DE); Detlef Schlager, Taufkirchen (DE); Jens Naumann, Chemnitz (DE); Sebastian Petzsch, Chemnitz (DE); Thomas Kuhwald, Markt Schwaben (DE); Andrew Schaefer, Oberhaching (DE); Michael Grimm, Anzing (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 0 days.

(21) Appl. No.: 17/554,812

(22) Filed: Dec. 17, 2021

(65) Prior Publication Data

US 2022/0231769 A1 Jul. 21, 2022

(30) Foreign Application Priority Data

Jan. 18, 2021 (EP) .................................... 21152101

(51) Int. Cl.
*H04B 17/00* (2015.01)
*H04B 17/11* (2015.01)
*H04B 3/46* (2015.01)

(52) U.S. Cl.
CPC ........... *H04B 17/0085* (2013.01); *H04B 3/46* (2013.01); *H04B 17/11* (2015.01)

(58) Field of Classification Search
CPC ...... H04B 17/0085; H04B 3/46; H04B 17/11; G01R 13/0254

(Continued)

(56) References Cited

U.S. PATENT DOCUMENTS 7,030,625 B1 * 4/2006 Boudiaf ............... G01R 35/005
324/638
10,454,600 B2 * 10/2019 Leibfritz ............... H04B 17/364
(Continued)

FOREIGN PATENT DOCUMENTS

| CN | 104917582 A | 9/2015 |
| CN | 110954728 A | 4/2020 |
| EP | 3002593 A1 | 4/2016 |

OTHER PUBLICATIONS

Ramón J Aliaga et al: "PET System Synchronization and Timing Resolution Using High-Speed Data Links", IEEE Transactions on Nuclear Science, IEEE Service Center, New York, NY, US, vol. 58, No. 4, dated Aug. 1, 2011, pp. 1596-1605 [Abstract Only].
(Continued)

*Primary Examiner* — Don N Vo
(74) *Attorney, Agent, or Firm* — Patterson + Sheridan, LLP

(57) ABSTRACT

The present disclosure provides a main measurement device for simultaneously measuring signals with at least one secondary measurement device, the main measurement device comprising a reference signal output port configured to couple to the at least one secondary measurement device, a reference signal generator coupled to the reference signal output port and configured to generate a reference signal, a measurement port configured to receive a signal to be measured, a trigger output port configured to couple to a trigger input port of the at least one secondary measurement device and to output a trigger signal, and a controllably switchable internal signal path configured to selectively couple the reference signal generator with the measurement port. Further, the present invention discloses a respective secondary measurement device, a respective measurement system, and a respective method.

16 Claims, 6 Drawing Sheets

(58) Field of Classification Search
USPC .............................. 375/224, 228; 455/67.14
See application file for complete search history.

(56) References Cited

U.S. PATENT DOCUMENTS

| | | |
|---|---|---|
| 2010/0121597 A1 | 5/2010 | Steffens et al. |
| 2012/0191418 A1 | 7/2012 | Cheng |
| 2013/0076409 A1 | 3/2013 | Delbue et al. |
| 2014/0023048 A1 | 1/2014 | Vu et al. |

OTHER PUBLICATIONS

Pan Weibin et al: "High resolution distributed time-to-digital converter (TDC) in a White Rabbit network", Nuclear Instruments & Methods in Physics Research. Section A, Elsevier BV * North-Holland, NL. vol. 738, dated Dec. 11, 2013, pp. 13-19.

Bing Chen et al: "The design of ethernet-based distributed interpolator", Industrial Electronics and Applications, 2008. ICIEA 2008. 3rd IEEE Conference on, IEEE, Piscataway, NJ, USA, dated: Jun. 3, 2008, pp. 1371-1373 [Abstract Only].

European Patent Office, Extended European Search Report for Application 21152101.8 dated Jul. 28, 2021.

* cited by examiner

MAIN MEASUREMENT DEVICE, SECONDARY MEASUREMENT DEVICE, MEASUREMENT SYSTEM AND METHOD

TECHNICAL FIELD

The disclosure relates to a main measurement device, a secondary measurement device, a measurement system and a respective method.

BACKGROUND

Although applicable to any electronic device with signal inputs, the present disclosure will mainly be described in conjunction with measurement devices.

During the development of modern electronic devices, a plurality of measurement tasks are usually performed. For example, signals in a circuit may be measured to verify if a circuit is operating correctly.

With increasing complexity of the electronic devices more signals may need to be measured. To this end, measurement devices, like oscilloscopes may either be provided with more signal inputs, or multiple measurement devices may be coupled together to use the signal inputs of the coupled devices. Coupling multiple measurement devices, however, usually requires complex coupling and synchronization between the measurement devices.

Accordingly, there is a need for simplifying the connection of multiple measurement devices.

SUMMARY

The above stated problem is solved by the features of the independent claims. It is understood, that independent claims of a claim category may be formed in analogy to the dependent claims of another claim category.

Accordingly, it is provided:

A main measurement device for simultaneously measuring signals with at least one secondary measurement device, the main measurement device comprising a reference signal output port configured to couple to the at least one secondary measurement device, a reference signal generator coupled to the reference signal output port and configured to generate a reference signal, a measurement port configured to receive a signal to be measured, a trigger output port configured to couple to a trigger input port of the at least one secondary measurement device and to output a trigger signal, and a controllably switchable internal signal path configured to selectively couple the reference signal generator internally with the measurement port.

Further, it is provided:

A secondary measurement device for simultaneously measuring signals with a main measurement device, the secondary measurement device comprising a reference signal input port configured to couple to a reference signal output port of the main measurement device, a measurement port configured to receive a signal to be measured, a trigger input port configured to receive an external trigger signal, especially from the main measurement device, and a controllably switchable internal signal path configured to selectively couple the reference signal input port internally with the measurement port.

Further, it is provided:

A measurement system comprising a main measurement device with a communication interface according to the present disclosure, and at least one secondary measurement device with a communication interface according to the present disclosure, wherein the communication interface of the main measurement device is coupled to the communication interface of the at least one secondary measurement device, wherein the reference signal output port of the main measurement device is coupled to the reference signal input port of the at least one secondary measurement device, and wherein the trigger output port of the main measurement device is coupled to the trigger input port of the at least one secondary measurement device.

Further, it is provided:

A method for synchronizing simultaneous measurement of signals with a main measurement device and at least one secondary measurement device, the main measurement device comprising a reference signal output port, a measurement port, a trigger output port, and a communication interface, and the at least one secondary measurement device comprising a reference signal input port coupled to the reference signal output port, a measurement port, a trigger input port coupled to the trigger output port, and a communication interface coupled to the communication interface of the main measurement device, the method comprising outputting a reference signal generated by a reference signal generator in the main measurement device via the reference signal output port of the main measurement device to the reference signal input port of the at least one secondary measurement device, internally coupling the reference signal generator with the measurement port of the main measurement device, internally coupling the reference signal input port of the at least one secondary measurement device with the measurement port of the at least one secondary measurement device, measuring the reference signal with the measurement port of the main measurement device, measuring the reference signal with the measurement port of the at least one secondary measurement device, generating a main timestamp for the measured reference signal in the main measurement device, outputting a trigger signal via the trigger output port of the main measurement device concurrently with generating the main timestamp, generating a secondary timestamp for the measured reference signal in the at least one secondary measurement device upon receipt of the trigger signal, determining a skew time based on the data measured in the main measurement device and the main timestamp and the data measured in the at least one secondary measurement device and the respective secondary timestamp.

The present disclosure is based on the finding that synchronizing multiple measurement devices usually is a complex task that requires additional synchronization hardware, like additional signal sources or the like.

The present disclosure therefore tries to simplify the synchronization of multiple measurement devices like e.g., oscilloscopes, and the simultaneous measurement of signals that are to be measured.

To this end, the present disclosure provides the main measurement device and secondary measurement devices, which may be combined in a respective measurement system. It is understood, that in a measurement system according to the present disclosure, any number of secondary measurement devices may be combined with a main measurement device.

The main measurement device comprises a reference signal generator that generates a reference signal. The reference signal serves as the base signal for the synchronization of multiple measurement devices. The reference signal may e.g., be a signal with a predetermined frequency, like 10 MHz, or the like. In the secondary measurement devices, the reference signal may mainly serve for synchronizing their internal reference signal generators to run with the same speed as the reference signal generator of the main measurement device. The reference signal generators may comprise e.g., a phase-locked loop or PPL, that may synchronize with a received reference signal. For a stand-alone operation, in addition, a clock source like e.g., a quartz oscillator with the required frequency, may be provided.

However, synchronizing multiple measurement devices only via the reference signal does not allow to provide highly synchronized measurement devices, because internal runtimes and tolerances of electronic elements may still introduce time variations in the single measurement devices.

The present invention therefore provides the main measurement device and the secondary measurement devices with the ability to highly synchronize their operation. To this end, the switchable internal signal path is provided in the main measurement device, as well as in the secondary measurement device.

In the main measurement device, the switchable internal signal path may selectively couple the reference signal generator with the measurement port. Therefore, the reference signal as generated in the reference signal generator of the main measurement device may be measured by the measurement port of the measurement device. At the same time the reference signal is output via the reference signal output port to the secondary measurement devices.

In the secondary measurement devices, the switchable internal signal path may selectively couple the reference signal input port with the measurement port. Therefore, in the secondary measurement devices, the reference signal as generated by the reference signal generator of the main measurement device may be measured.

It is understood, that the measurement ports of the main measurement device and the secondary measurement devices may be the measurement ports as provided by the respective measurement device for performing their intended measurement tasks. Such measurement ports may in embodiments comprise any combination of external hardware connectors, amplifiers, attenuators, analog-to-digital converters, a trigger system and an acquisition memory, but are not limited to these elements. In addition, the main measurement device and the secondary measurement devices may comprise any number of measurement ports, like 2 or 4.

In the main measurement device and the secondary measurement devices, the switchable internal signal path may couple the reference signal generator or the reference signal input port to the respective measurement port after the external hardware connectors, such that the reference signal runs through the complete internal signal chain of the respective measurement port.

The main measurement device and the secondary measurement devices are also coupled via a trigger output port of the main measurement device that is coupled to the trigger input ports of the secondary measurement devices. It is understood, that the main measurement device may in embodiments be the only source of the trigger signal and provide the trigger signal to the secondary measurement devices. The trigger signal may be generated by the main measurement device based on predefined or user-defined trigger conditions. It is understood, that upon generation or reception of the trigger signal, measurement in the respective measurement device may be stopped. The measurement not necessarily is stopped immediately, instead signals may be measured for a predefined amount of time before and after the measurement. To this end, the measurement ports may comprise a ring-buffer like memory and may permanently record measurement data in the memory.

In order to exchange the data that allows determining the time variation or skew time between the main measurement device and the secondary measurement devices, the main measurement device and the secondary measurement devices may exchange the required data.

With the features of the main measurement device and the secondary measurement devices, it is possible to record the same signal i.e., the reference signal, in different measurement devices at the same time. Further the same trigger signal may trigger the main measurement device and all secondary measurement devices at the same time.

After performing a respective measurement, the measured data may be exchanged between the main measurement device and the secondary measurement devices to compare the data and perform calculations of the skew time between the different devices.

Therefore, it is easily possible to synchronize the main measurement device with the secondary measurement devices for performing a common measurement task.

It is understood, that a single measurement device in one case may serve as a main measurement device and in another case as a secondary measurement device. Such a single measurement device may therefore comprise the features of the main measurement device and the secondary measurement device of the present disclosure. The specific function i.e., master or slave, of the single measurement device may be configured e.g., via a user interface of the single measurement device. In such an embodiment, the switch may be controlled to couple the measurement port either to the reference signal generator or the reference signal input port, as required.

By allowing measurement devices to operate in a highly synchronized manner, the present invention allows easily increasing the number of measurement ports that may be used for a specific measurement task. If for example, two measurement devices with four measurement ports each are combined according to the present disclosure, a total of eight measurement ports may be used in the respective measurement task without the need to provide specific additional hardware.

Further embodiments of the present disclosure are subject of the further dependent claims and of the following description, referring to the drawings.

In an embodiment, the main measurement device may comprise a device controller coupled to the reference signal generator and the switchable internal signal path. The device controller may be configured to perform in a calibration operation mode a calibration of the synchronization between the main measurement device and the at least one secondary measurement device by controlling the reference signal generator to output the reference signal via the reference signal output port to the at least one secondary measurement device, controlling the switchable internal signal path to couple the reference signal generator with the measurement port, controlling the measurement port to measure the reference signal provided by the reference signal generator via the switchable internal signal path, and generating a main timestamp for the measured reference signal and outputting a trigger signal via the trigger output port at the same time.

It is understood, that the main measurement device and the secondary measurement devices may be switched to operate in a calibration operation mode or a measurement operation mode. A user may for example be provided with respective controls on a user interface of the main measurement device and the secondary measurement devices. Further, the main measurement device may control the secondary measurement devices to switch from the measurement operation mode to the calibration operation mode and vice versa e.g., via a communication interface.

In the calibration operation mode, device controllers of the main measurement device and the secondary measurement devices perform specific tasks to synchronize the main measurement device with the secondary measurement devices in order to perform a simultaneous measurement of signals in the measurement operation mode after calibration is completed.

The device controllers of the main measurement device and the secondary measurement devices may be provided as a dedicated processing element, like e.g. a processing unit, a microcontroller, an FPGA, a CPLD or the like. The device controller may at least in part also be provided as a computer program product comprising computer readable instructions that may be executed by a processing element. In a further embodiment, the device controller may be provided as addition or additional function or method to the firmware or operating system of a processing element that is already present in the respective application. In addition, it is understood, that any required supporting or additional hardware may be provided like e.g., a power supply circuitry and clock generation circuitry.

The device controller of the main measurement device in the calibration operation mode controls the reference signal generator to output the reference signal. It is understood, that a control line may be provided between the device controller and the reference signal generator to switch the reference signal generator on or off or to close a signal line of a permanently running reference signal generator e.g., a quartz oscillator as indicated above. The reference signal is output via the reference signal output port.

In addition, the device controller controls the switchable internal signal path to couple the reference signal generator with the measurement port of the main measurement device for providing the reference signal to the measurement port. The device controller also controls the measurement port to measure the provided reference signal. The reference signal may, therefore, be measured in the main measurement device and the secondary measurement devices at the same time. It is understood, that the term controlling is to be understood as comprising any action or computation that is required to perform the respective action. For example, the device controller may close a switch in the switchable internal signal path via a respective control line and control the signal acquisition elements of the measurement port accordingly.

While the reference signal is measured in the main measurement device and the secondary measurement devices, the device controller generates a trigger signal that is output via the trigger output port to the secondary measurement devices and at the same time generates a main timestamp for the reference signal measured by the measurement port.

The device controller of a secondary measurement device controls in the calibration operation mode the switchable internal signal path of the secondary measurement device to couple the reference signal input port with the measurement port of the secondary measurement device. The reference signal input port of the secondary measurement device is coupled with the reference signal output port of the main measurement device via a cable, and the reference signal generated in the main measurement device is therefore available at the measurement port of the secondary measurement device.

In the secondary measurement device, the device controller also controls the measurement port to measure the reference signal, and upon reception of the trigger signal generated in the main measurement device, generates a secondary timestamp for the measured data.

After the main timestamp and the secondary timestamps are generated, different versions of the reference signal are available as measured data in the main measurement device and the secondary measurement devices, wherein the waveforms of the measured versions of the reference signal are shifted by an amount that corresponds to the time misalignment between the main measurement device and the secondary measurement devices.

Based on the measured data and the main timestamp together with the secondary timestamps it is therefore possible to calculate the time misalignment and correct measurement data in a measurement operation mode of the main measurement device and the secondary measurement devices.

In a further embodiment, the main measurement device may comprise a communication interface, and the device controller in the calibration operation mode may further be configured to receive via the communication interface the reference signal as measured by the at least one secondary measurement device together with a secondary timestamp generated by the at least one secondary measurement device upon receipt of the trigger signal. The at least one secondary measurement device may comprise a respective communication interface. The device controller in the main measurement device may be configured to calculate a coarse timing variation between the main measurement device and the at least one secondary measurement device based on the difference between the secondary timestamp and the main timestamp, to calculate a granular timing variation between the main measurement device and the at least one secondary measurement device based on the phase difference between the phase of the reference signal as measured by the measurement port at the time of occurrence of the main timestamp and as measured by the at least one secondary measurement device at the time of occurrence of the secondary timestamp, and to calculate a skew time as the sum of the coarse timing variation and the granular timing variation.

After measuring the reference signal, the secondary measurement devices may provide the measurement data, including the secondary timestamps, to the main measurement device. The device controller of the main measurement device may then calculate two different timing variations for each one of the secondary measurement devices.

A coarse timing variation is the difference between the secondary timestamp of the respective secondary measurement device and the main timestamp. This is required, because each measurement device may create the respective timestamp simply based on a counter. For example, a counter that starts running, when the respective device is turned on. Therefore, the timers are usually not synchronized regarding their start time. However, the counters may be synchronized regarding their counting frequency, e.g. via the reference signal that may also be provided to the internal reference signal generators e.g., the above-mentioned phase locked loops, of the secondary measurement devices. The counters used for creating the timestamps usually comprise a rather low temporal resolution. Therefore, after calculating the coarse timing variation, the device controller in the main measurement device may calculate the granular timing variation.

Since the measured data is provided from the secondary measurement devices to the main measurement device including the secondary timestamps, the device controller may analyze the measurement data at the point of occurrence of the timestamps in detail. The device controller for calculating the granular timing variation will calculate the phase difference between the phase of the reference signal as measured by the measurement port of the respective secondary measurement device at the point of occurrence of the secondary timestamp and as measured by the main measurement device at the point of occurrence of the main timestamp.

A respective formula for the coarse timing variation may be $$TVc=TSs-TSm$$

Therein TVc is the coarse timing variation, TSs is the value of the secondary timestamp and TSm is the value of the main timestamp.

A formula for the coarse timing variation may be $$TVf=d(phy)/(360°*fref)$$

Therein TVf is the granular timing variation, d(phy) is the phase difference between the between the phase of the reference signal as measured by the measurement port of the respective secondary measurement device at the point of occurrence of the secondary timestamp and as measured by the main measurement device at the point of occurrence of the main timestamp, and fref is the frequency of the reference signal.

The respective skew time may be:

$$tskew=TVc+TVf=(TSs-TSm)+(d(phy)/(360°*fref))$$

In the measurement operation mode, the measurement data may then be shifted by the skew time tskew.

In another embodiment, the device controller may be configured to further calculate the skew time based on a cable runtime of a cable used to couple the reference output port to the at least one secondary measurement device and/or internal signal runtimes of the main measurement device and/or the secondary measurement device.

For further improving the synchronization between the main measurement device and the secondary measurement devices, the signal runtimes in the cables and in the measurement devices may also be taken into account. These signal runtimes may also be referred to as signal distribution time. The relevant cable-based signal runtime is the signal runtime in the cable that transports the reference signal from the main measurement device to the secondary measurement devices.

It is understood, that the signal runtimes in the cables may be predetermined and may be provided with the cable to the user. It is understood, that the measurement devices may provide input means for a user to input the respective runtime. In addition, or as alternative, default types of cables may be used with a known runtime that may be preprogrammed in the measurement devices.

Further, the signal runtime in the cable may be measured by one of the measurement devices e.g., by the main measurement device. Measuring the cable runtime may be performed before determining the timing variations. The cable may e.g. be coupled from the reference signal output port of the main measurement device to a second measurement port of the main measurement device. At the same time the device controller may control the switchable internal signal path to internally provide the reference signal to the first measurement port. The device controller may then, as indicated above for the granular timing variation determine the cable runtime based on the phase difference between the two measured signals.

It is understood, that the internal runtimes, for example the runtime of the reference signal in the switchable internal signal path, may be predetermined and stored in the measurement devices e.g., during production of the measurement devices.

The cable runtimes and the internal runtimes may be named tr. The formula for the skew time may then be written as:

$$tskew=TVc+TVf-tr=(TSs-TSm)+(d(phy)/(360°*fref))-tr$$

In another embodiment, the device controller may further be configured to transmit the reference signal as measured by the measurement port with the main timestamp via the communication interface to the at least one secondary measurement device, and to receive the skew time via the communication interface from the at least one secondary measurement device.

It is understood, that instead of calculating the skew time in the main measurement device, the skew time may also be calculated in the secondary measurement devices. To this end, the device controller in the main measurement device may transmit the recorded data to the secondary measurement devices, which may then perform the required calculations.

It is understood, that all the above explanations regarding the calculation in the main measurement device apply mutatis mutandis to the calculation in the secondary measurement devices.

In an embodiment, the device controller in the main measurement device may be configured to synchronize measurement data in a measurement operation mode by controlling the measurement port to measure an external signal to be measured, generating upon occurrence of a trigger condition in the external signal a main timestamp and a trigger signal, outputting the trigger signal via a trigger output port of the main measurement device, receiving via the communication interface measurement data from the at least one secondary measurement device, the measurement data including a secondary measurement timestamp, and timely shifting the received measurement data based on the secondary measurement timestamp and the skew time. Alternatively, the main timestamp is provided via the communication interface to the at least one secondary measurement device.

After determining the skew time or timing variation between the main measurement device and the secondary measurement devices, the measurement devices may operate fully synchronized in a measurement operation mode.

In the measurement operation mode, the main measurement device may measure an external signal i.e., the signal to be measured, via the measurement port. Upon the occurrence of a trigger condition in the external signal, the device controller outputs a respective trigger signal via a trigger output port to all the secondary measurement devices.

The secondary measurement devices will in embodiments then receive the trigger signal and provide the recorded data to the main measurement device with a secondary timestamp via the communication interface. The device controller in the main measurement device may then shift the measurement data based on the secondary timestamp minus the skew time. If the data is provided to the main measurement device, the data may be analyzed by a user in the main measurement device easily.

Alternatively, the main measurement device may provide the main timestamp to the secondary measurement devices, and the secondary measurement devices may shift the trigger time in the measured data to the time of the main timestamp plus the skew time.

BRIEF DESCRIPTION OF THE DRAWINGS

For a more complete understanding of the present disclosure and advantages thereof, reference is now made to the following description taken in conjunction with the accompanying drawings. The disclosure is explained in more detail below using exemplary embodiments which are specified in the schematic figures of the drawings, in which.

In the figures like reference signs denote like elements unless stated otherwise.

DETAILED DESCRIPTION OF THE DRAWINGS

Figure 1:
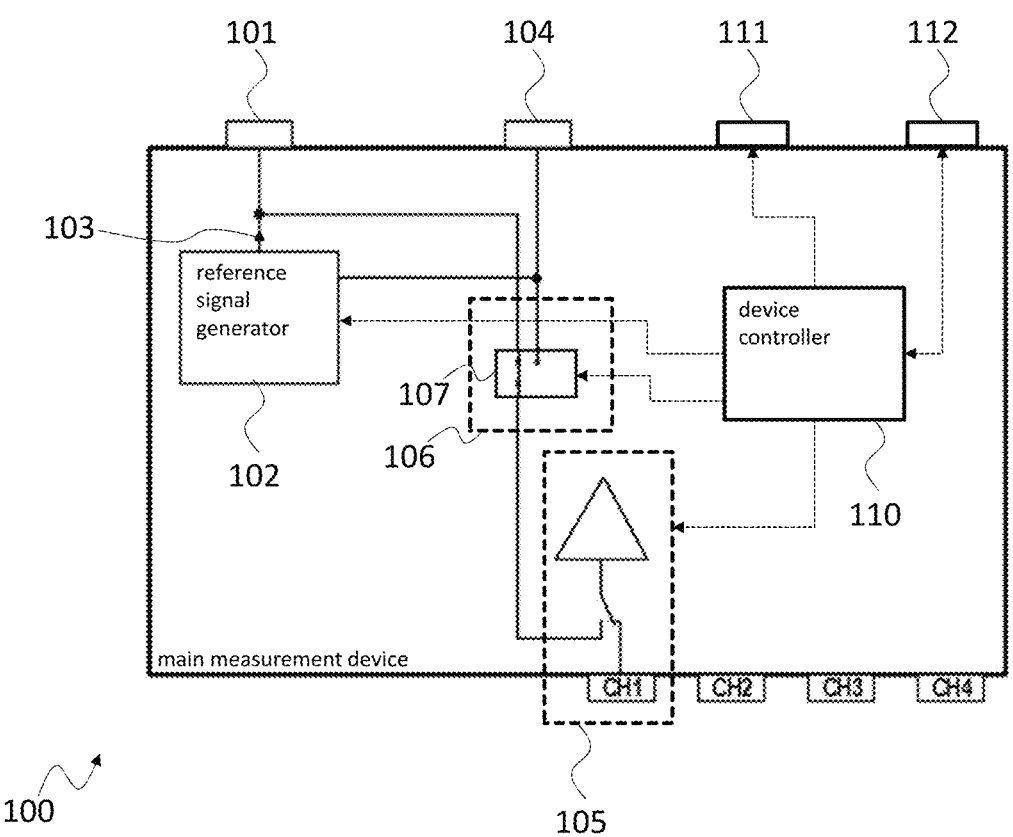
FIG. 1 shows a block diagram of an embodiment of a main measurement device according to the present disclosure.

FIG. 1 shows a block diagram of a main measurement device 100. The main measurement device 100 comprises a reference signal output port 101 that is coupled to a reference signal generator 102. In addition, the main measurement device 100 comprises an optional reference signal input port 104. The main measurement device 100 comprises a first measurement port 105, wherein three further measurement ports (not separately referenced) are also provided. It is understood, that at least one measurement port is provided in the main measurement device 100, and that any larger number of measurement ports may be provided.

The output of the reference signal generator 102 and the reference signal input port 104 are further each coupled to an input of a switchable internal signal path 106. The output of the switchable internal signal path 106 is coupled to the measurement port 105 and may be coupled via a switch 107 either to the reference signal generator 102 or to the reference signal input port 104. It is understood, that the output of the switchable internal signal path 106 may also be coupled to the other measurement ports. In the main measurement device 100 the switch 107 is controlled to couple the reference signal generator 102 with the measurement port 105.

Further, a device controller 110 is provided that is coupled to the reference signal generator 102, the switch 107, and the measurement port 105 as well as to a trigger output port 111 and a communication interface 112.

It is understood, that the main measurement device 100 may be a device that is capable of operation as main measurement device as well as secondary measurement device. To this end, the reference signal input port 104 is provided and coupled to the reference signal generator 102. Although not explicitly shown, the main measurement device 100 to this end may also comprise a trigger input port (see FIG. 2).

As indicated above, the device controller 110 may be a dedicated controller implemented in hardware or software or a combination thereof. In the main measurement device 100 the device controller 110 may also be implemented as an addition to the functionality of a controller of the main measurement device 100 that is provided to perform the original functions of the main measurement device 100. Such a controller may comprise a processor coupled to a memory. Computer executable instructions may be stored in the memory that when executed by the processor, cause the processor to perform the required functions. Such computer readable instructions may be amended to include the additional instruction for controlling the elements of the main measurement device 100 as required to implement the functions of the present disclosure. As alternative, the function of the device controller 110 may be distributed in different elements of the main measurement device 100. For example, the function of controlling the reference signal generator 102 and communicating via the communication interface 112 may be performed in a processor. The function of generating the trigger signal and outputting the trigger signal via the trigger output port 111 may e.g. be performed in a dedicated trigger element or trigger logic of the measurement port 105.

The capability of the device controller 110 to control the elements of the main measurement device 100 is indicated by dashed lines. It is understood, that respective signal lines and supporting hardware may be provide as required.

In embodiments, the reference signal generator 102 may be configured to generate a 10 MHz reference signal 103, especially a sine signal with a frequency of 10 MHz. Although it is understood, that any other type of reference signal is also possible. The reference signal 103 serves for synchronizing the reference oscillators in the secondary measurement devices with the reference signal generator 102 regarding their speed and is therefore provided to the secondary measurement devices via the reference signal output port 101. In the main measurement device 100 the reference signal input port 104 remains unused during calibration.

The communication interface 112 for communicating with the secondary measurement devices may comprise a network interface, like e.g. an Ethernet interface or any other type of digital data interface, like e.g. a digital data bus.

During calibration of the synchronization of the main measurement device 100 with secondary measurement devices, different functions are performed, which will be described in detail with regard to FIG. 3, where a complete measurement system is shown.

Figure 2:
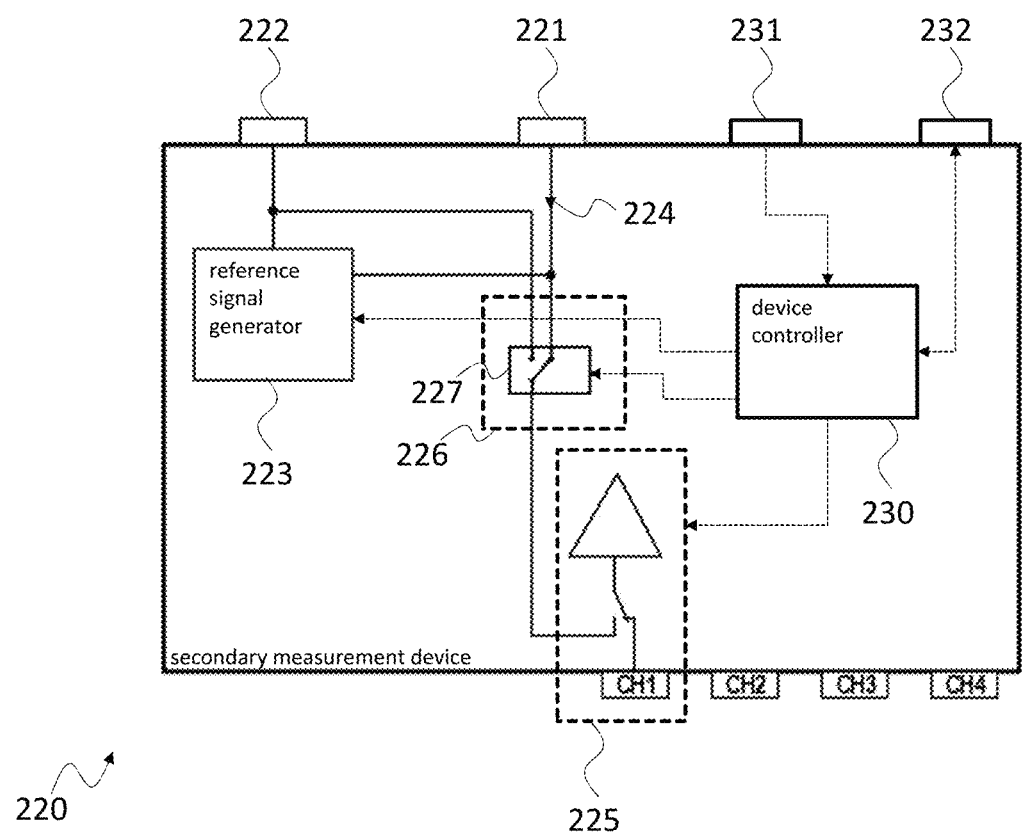
FIG. 2 shows a block diagram of an embodiment of a secondary measurement device according to the present disclosure.

FIG. 2 shows a block diagram of a secondary measurement device 220. The secondary measurement device 220 comprises a reference signal input port 221 coupled to an input of a reference signal generator 223 and an input of a switchable internal signal path 226. Another input of the switchable internal signal path 226 is coupled to an output of the reference signal generator 223. The output of the reference signal generator 223 is further coupled to reference signal output port 222, which in the case of the measurement device being a secondary measurement device 220 is not used.

An output of the switchable internal signal path 226 is coupled to a measurement port 225. The secondary measurement device 220 comprises a total of four measurement ports. It is understood, that any number of measurement ports starting with one is possible. In the secondary measurement device 220, the measurement port 225 may either be coupled to the reference signal generator 223 or to reference signal input port 221 via switch 227. In the secondary measurement device 220 the switch 227 is controlled to couple the measurement port 225 to the reference signal input port 221.

The secondary measurement device 220 also comprises a device controller 230. The device controller 230 is coupled to the reference signal generator 223, the switch 227, and the measurement port 225 as well as to a trigger input port 231 and a communication interface 232.

It is understood, that the secondary measurement device 220 may be a device that is capable of operation as main measurement device as well as secondary measurement device. To this end, the reference signal output port 222 is provided. Although not explicitly shown, the secondary measurement device 220 to this end may also comprise a trigger output port (see FIG. 1).

The explanations regarding the device controller 110 provided with regard to FIG. 1 apply mutatis mutandis to device controller 230. The same applies to reference signal generator 223, and communication interface 232.

Figure 3:
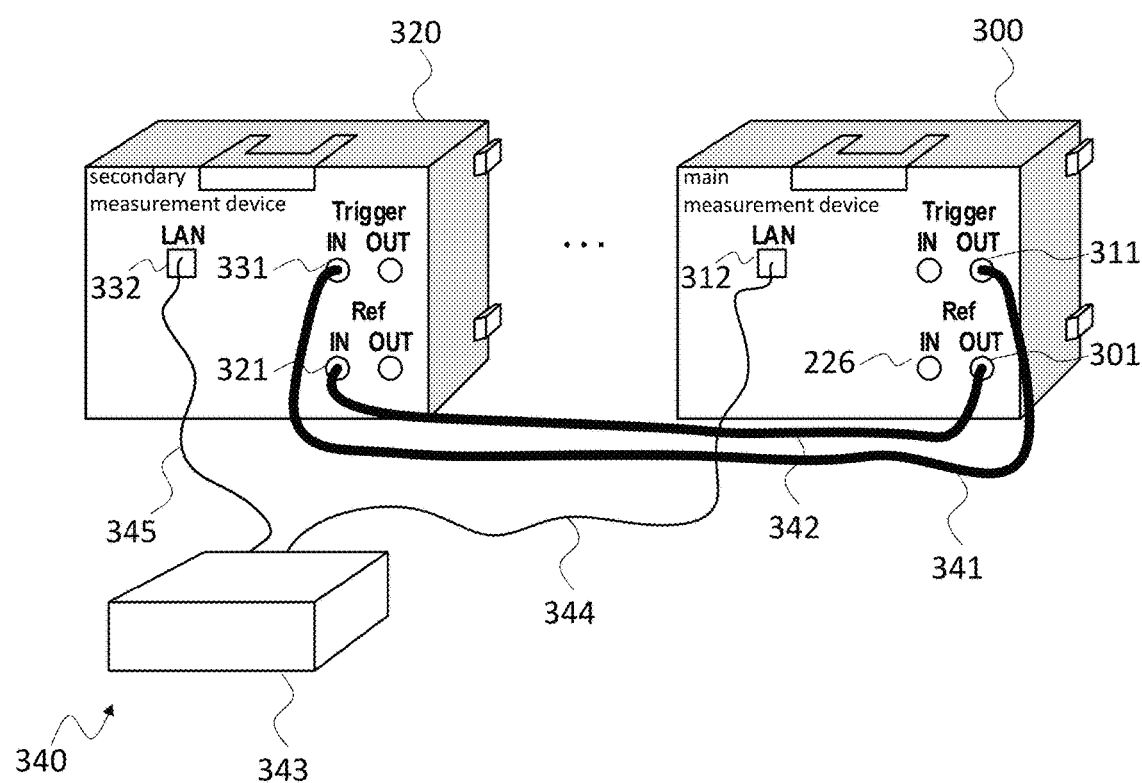
FIG. 3 shows a block diagram of an embodiment of a measurement system according to the present disclosure.

FIG. 3 shows a block diagram of an embodiment of a measurement system 340. The measurement system 340 comprises a main measurement device 300, and a secondary measurement device 320, while more possible secondary measurement devices are hinted at by three dots.

The communication interface 312 of the main measurement device 300 is coupled to the communication interface 332 of the secondary measurement device 320 indirectly via LAN cables 344, 345 and switch 343. The reference signal output port 301 of the main measurement device 300 is coupled to the reference signal input port 321 of the secondary measurement device 320 via cable 342. In addition, the trigger output port 311 of the main measurement device 300 is coupled to the trigger input port 331 of the at least one secondary measurement device 320 via cable 341.

In order to calibrate the synchronization of the main measurement device 300 with the secondary measurement device 320, both devices 300, 320 perform specific tasks in a calibration operation mode. After performing the calibration, the devices 300, 320 may continue operating in a measurement operation mode.

In the calibration operation mode, the reference signal generator of the main measurement device 300 outputs the reference signal via the reference signal output port 301 to the secondary measurement device 320, and via the switchable internal signal path to the measurement port of the main measurement device 300.

In the secondary measurement device 320 the received reference signal is provided from the reference signal input port 321 via the switchable internal signal path to the measurement port of the secondary measurement device 320.

In the main measurement device 300 the measurement port measures the reference signal provided by the reference signal generator via the switchable internal signal path. In the secondary measurement device 320 the measurement port measures the reference signal provided from the reference signal input port 321 via the switchable internal signal path.

In the main measurement device 300 a main timestamp is generated for the measured reference signal and a trigger signal is output via the trigger output port 311 at the same time to the secondary measurement device 320.

In the secondary measurement device 320 a secondary timestamp is generated for the measured reference signal upon receipt of a trigger signal via the trigger input port 331.

In an embodiment, after generating the main time stamp and the secondary time stamp, the reference signal as measured by the measurement port of the main measurement device 300 with the main timestamp is transmitted via the communication interface 312 to the at least one secondary measurement device 320.

In the secondary measurement device 320 a coarse timing variation between the main measurement device 300 and the secondary measurement device 320 is then calculated based on the difference between the main timestamp and the secondary timestamp. A granular timing variation between the main measurement device 300 and the secondary measurement device 320 is further calculated based on the phase difference between the phase of the reference signal as measured by the measurement port of the secondary measurement device 320 at the secondary timestamp and as measured by the main measurement device 300 at the main timestamp. A skew time is then calculated as the sum of the coarse timing variation and the granular timing variation.

In another embodiment, the reference signal as measured by the measurement port of the secondary measurement device 320 is transmitted with the secondary timestamp via the communication interface 332 to the main measurement device 300. The calculations as explained above, may then be performed in the main measurement device 300. A coarse timing variation between the main measurement device 300 and the secondary measurement device 320 may be calculated based on the difference between the main timestamp and the secondary timestamp. A granular timing variation between the main measurement device 300 and the secondary measurement device 320 is calculated based on the phase difference between the phase of the reference signal as measured by the measurement port of the secondary measurement device 320 at the secondary timestamp and as measured by the measurement port of the main measurement device 100, 300 at the main timestamp. The skew time is calculated as the sum of the coarse timing variation and the granular timing variation.

In both embodiments, the skew time may further be calculated based on a cable runtime of the cable 342 used to couple the reference output port 301 to the at least one secondary measurement device 320. In addition, internal signal runtimes of the main measurement device 300 and/or the secondary measurement device 320 may also be taken into account.

After performing the calibration, both measurement devices 300, 320 may be switched into a measurement operation mode. In this operation mode, the measurement ports of the main measurement device 300 and the secondary measurement device 320 are coupled to a respective signal source e.g., a device under test.

For performing the measurement, the reference signal generator in the main measurement device 300 generates the reference signal, that is provided via reference signal output port 301 to reference signal input port 321 of secondary measurement device 320.

The main measurement device 300 upon occurrence of a trigger condition in the external signal that is to be measured generates a main timestamp and a trigger signal. The trigger signal is provided via trigger output port 311 to the trigger input port 331 of the secondary measurement device 320.

In an embodiment, the main measurement device 300 receives via the communication interface 312, 332 the measurement data from the secondary measurement device

320, including a secondary measurement timestamp. The main measurement device 300 then timely shifts the received measurement data based on the secondary measurement timestamp and the calculated skew time.

In another embodiment, the main measurement device 300 provides the main timestamp via the communication interface 312, 332 to the secondary measurement device 320.

The main timestamp is received in the secondary measurement device 320. And the secondary measurement device 320 timely shifts the measurement data of the signal measured in the secondary measurement device 320 based on the internal timestamp generated when the trigger signal was received, the main timestamp and the skew time.

For sake of clarity in the following description of the method-based FIG. 4 the reference signs used above in the description of apparatus based FIGS. 1-3 and 5-6 will be maintained.

Figure 4:
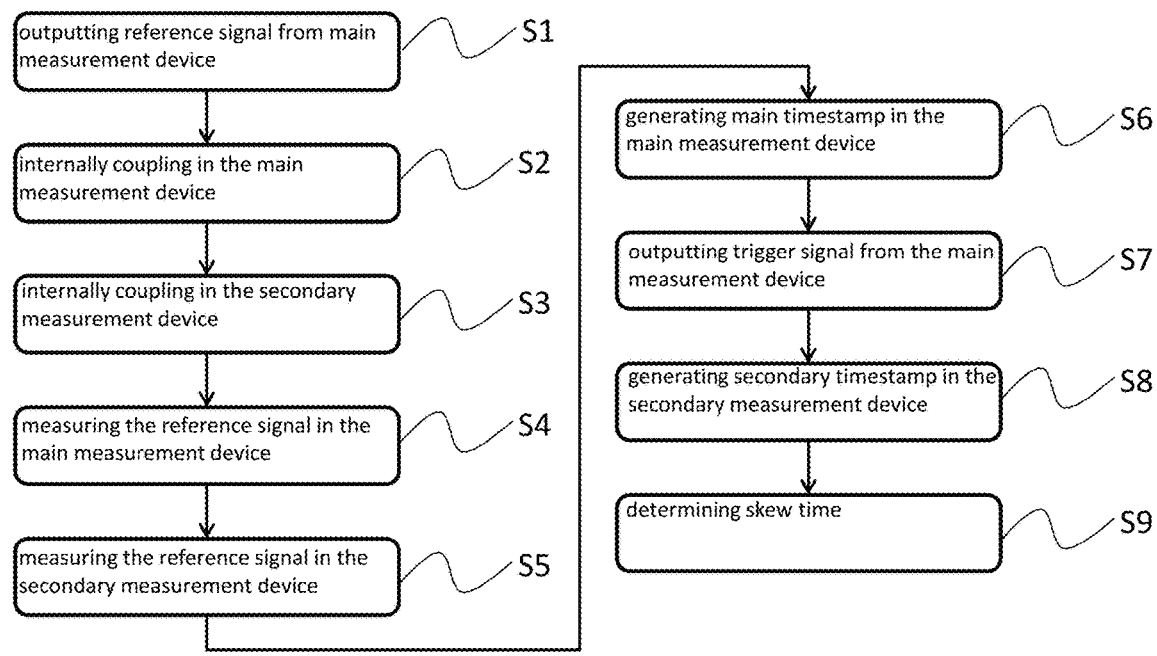
FIG. 4 shows a flow diagram of an embodiment of a method according to the present disclosure.

FIG. 4 shows a flow diagram of an embodiment of a method for synchronizing simultaneous measurement of signals with a main measurement device (100, 300) and at least one secondary measurement device 220, 320.

The main measurement device 100, 300 comprises a reference signal output port 101, 222, 301, a measurement port 105, 225, a trigger output port 111, 311, and a communication interface 112, 312, 232, 332. The at least one secondary measurement device 220, 320 comprises a reference signal input port 104, 221, 321 coupled to the reference signal output port 101, 222, 301, a measurement port 105, 225, a trigger input port 231, 331 coupled to the trigger output port 111, 311, and a communication interface 112, 312, 232, 332 coupled to the communication interface 112, 312, 232, 332 of the main measurement device 100, 300.

The method comprises outputting S1 a reference signal 103, 224 generated by a reference signal generator 102, 223 in the main measurement device 100, 300 via the reference signal output port 101, 222, 301 of the main measurement device 100, 300 to the reference signal input port of the at least one secondary measurement device 220, 320, internally S2 coupling the reference signal generator 102, 223 with the measurement port 105, 225 of the main measurement device 100, 300, internally S3 coupling the reference signal input port 104, 221, 321 of the at least one secondary measurement device 220, 320 with the measurement port 105, 225 of the at least one secondary measurement device 220, 320, measuring S4 the reference signal 103, 224 with the measurement port 105, 225 of the main measurement device 100, 300, measuring S5 the reference signal 103, 224 with the measurement port 105, 225 of the at least one secondary measurement device 220, 320, generating S6 a main timestamp for the measured reference signal 103, 224 in the main measurement device 100, 300, outputting S7 a trigger signal via the trigger output port 111, 311 of the main measurement device 100, 300 concurrently with generating the main timestamp, generating S8 a secondary timestamp for the measured reference signal 103, 224 in the at least one secondary measurement device 220, 320 upon receipt of the trigger signal, and determining S9 a skew time based on the data measured in the main measurement device 100, 300 and the main timestamp and the data measured in the at least one secondary measurement device 220, 320 and the respective secondary timestamp.

Determining the skew time in an embodiment comprises receiving in the main measurement device 100, 300 via the communication interface 112, 312, 232, 332 the reference signal 103, 224 as measured by the at least one secondary measurement device 220, 320 together with the secondary timestamp generated by the at least one secondary measurement device 220, 320 upon receipt of the trigger signal, calculating a coarse timing variation between the main measurement device 100, 300 and the at least one secondary measurement device 220, 320 based on the difference between the secondary timestamp and the main timestamp, calculating a granular timing variation between the main measurement device 100, 300 and the at least one secondary measurement device 220, 320 based on the phase difference between the phase of the reference signal 103, 224 as measured by the measurement port 105, 225 of the main measurement device 100, 300 at the main timestamp and as measured by the at least one secondary measurement device 220, 320 at the secondary timestamp, and calculating the skew time as the sum of the coarse timing variation and the granular timing variation.

In another embodiment, determining the skew time comprises receiving in the secondary measurement device 220, 320 via the communication interface 112, 312, 232, 332 the reference signal 103, 224 as measured by the main measurement device 100, 300 together with a main timestamp generated by the main measurement device 100, 300 upon generation of the trigger signal, calculating a coarse timing variation between the main measurement device 100, 300 and the secondary measurement device 220, 320 based on the difference between the main timestamp and the secondary timestamp, calculating a granular timing variation between the main measurement device 100, 300 and the secondary measurement device 220, 320 based on the phase difference between the phase of the reference signal 103, 224 as measured by the measurement port 105, 225 of the at least one secondary measurement device 220, 320 at the secondary timestamp and as measured by the main measurement device 100, 300 at the main timestamp, and calculating the skew time as the sum of the coarse timing variation and the granular timing variation.

Determining the skew time in any of the two embodiments, may comprise additionally determining the skew time based on a cable runtime of a cable 341, 342 used to couple the main measurement device 100, 300 to the at least one secondary measurement device 220, 320 and/or internal signal runtimes of the main measurement device 100, 300 and/or the secondary measurement device 220, 320.

The method after determining the skew time may comprise synchronizing measurement data by measuring a first external signal to be measured in the main measurement device 100, 300, measuring a second external signal to be measured in the at least one secondary measurement device 220, 320, generating in the main measurement device 100, 300 upon occurrence of a trigger condition in the external signal a main timestamp and a trigger signal, outputting the trigger signal to the at least one secondary measurement device 220, 320 concurrently with generating the main timestamp, generating in the at least one secondary measurement device 220, 320 a secondary timestamp upon reception of the trigger signal, and timely shifting measurement data of the measured second external signal.

Timely shifting may be performed based on the main timestamp and the secondary timestamp and the skew time by receiving in the main measurement device 100, 300 measurement data from the at least one secondary measurement device 220, 320 including the secondary measurement timestamp and in the main measurement device 100, 300 shifting the received measurement data based on the secondary measurement timestamp and the skew time, or by providing the main timestamp via the communication interface 112, 312, 232, 332 to the at least one secondary measurement device 220, 320, and in the at least one secondary measurement device 220, 320 shifting measurement data of the measured external signal based on the secondary timestamp, the main timestamp and the skew time.

Figure 5:
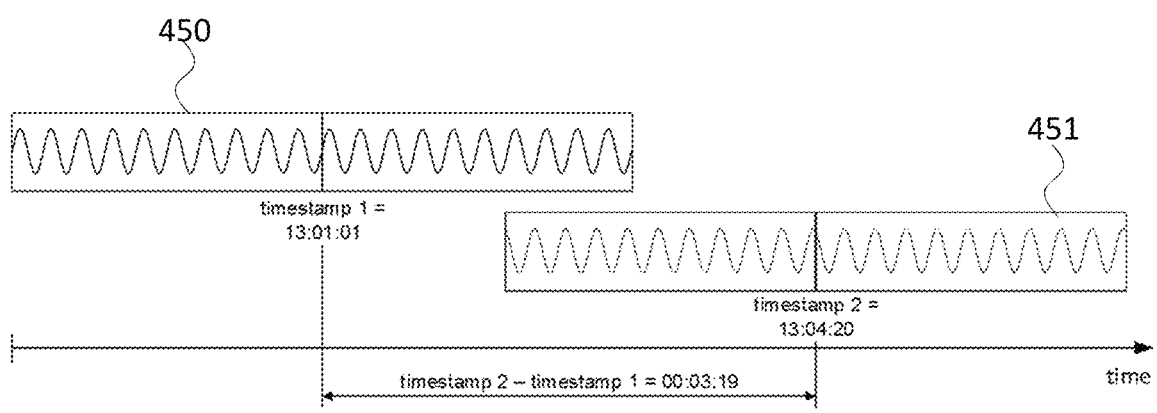
FIG. 5 shows a diagram showing a reference signal in a main measurement device and in a secondary measurement device.

FIG. 5 shows a diagram showing a reference signal 450 in a main measurement device with a corresponding timestamp 1 and a reference signal 451 in a secondary measurement device with corresponding timestamp 2.

It can be seen, that the reference signal 450 is generated in the main measurement device as a sine wave signal and is received in the secondary measurement device accordingly.

Upon generation of the trigger signal in the main measurement device, the main measurement device creates timestamp 1 with the exemplary value of 13:01:01. The secondary measurement device creates timestamp 2 with the exemplary value of 13:03:20 upon reception of the trigger signal.

The trigger signal and the reference signal require a certain time to travel to the secondary measurement device, therefore, the timestamp 2 will not be generated at the same position of the reference signal as timestamp 1.

Further, since the internal counters for generating the timestamps are not synchronized between the main measurement device and the secondary measurement device, the values of the timestamps vary arbitrarily.

As indicated above, the lack of synchronization of the counters may be covered by calculating the coarse timing variation i.e., the difference between the timestamp 2 and the timestamp 1.

However, such a difference calculation may not cover finer or more granular time variations.

Figure 6:
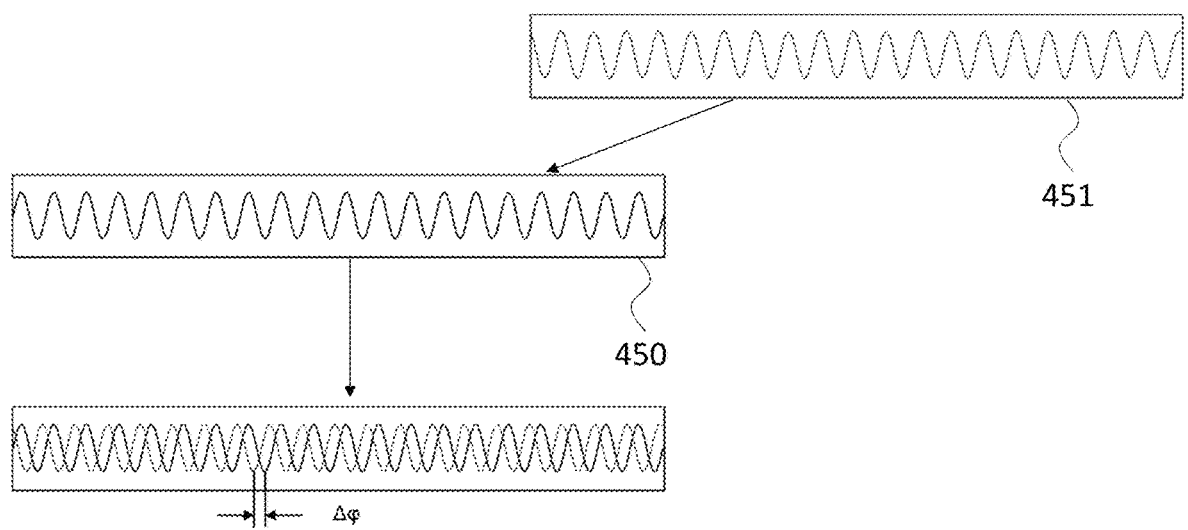
FIG. 6 shows a diagram showing a reference signal in a main measurement device and in a secondary measurement device with the corresponding phase difference.

The present disclosure therefore uses the phase difference between the two recordings of the reference signal to determine the granular time variation, as can be seen in more detail in FIG. 6 and the respective explanation.

FIG. 6 shows a diagram showing a reference signal 450 in a main measurement device and a reference signal 451 in a secondary measurement device with the corresponding phase difference $\Delta\varphi$.

Visually, the two recordings are overlaid after calculating and applying the coarse timing variation. Since the time difference in the timestamps is therefore already compensated, the remaining misalignment represents the granular timing variation.

The granular timing variation may be calculated as explained above, based on the phase difference between the two recordings of the reference signal.

In numbers, the skew time may be:

$$tskew = TVc + TVf - tr = (TSs - TSm) + (d(phy)/(360°*fref)) - tr$$

$$tskew = (13:04:20 - 13:01:01) + (115.5916°/360°*10\ MHz) - 5\ ns = 00:03:19 + 26.83099\ ns$$

Although specific embodiments have been illustrated and described herein, it will be appreciated by those of ordinary skill in the art that a variety of alternate and/or equivalent implementations exist. It should be appreciated that the exemplary embodiment or exemplary embodiments are only examples, and are not intended to limit the scope, applicability, or configuration in any way. Rather, the foregoing summary and detailed description will provide those skilled in the art with a convenient road map for implementing at least one exemplary embodiment, it being understood that various changes may be made in the function and arrangement of elements described in an exemplary embodiment without departing from the scope as set forth in the appended claims and their legal equivalents. Generally, this application is intended to cover any adaptations or variations of the specific embodiments discussed herein.

LIST OF REFERENCE SIGNS 100, 300 main measurement device
101, 301 reference signal output port
102 reference signal generator
103 reference signal
104 reference signal input port
105 measurement port
106 switchable internal signal path
107 switch
110 device controller
111, 311 trigger output port
112, 312 communication interface
220, 320 secondary measurement device
221, 321 reference signal input port
222 reference signal output port
223 reference signal generator
224 reference signal
225 measurement port
226 switchable internal signal path
227 switch
230 device controller
231, 331 trigger input port
232, 332 communication interface
340 measurement system
341, 342 cable
343 switch
344, 345 LAN cable
450 main measurement data
451 secondary measurement data
S1-S9 method step

The invention claimed is:

1. A main measurement device for simultaneously measuring signals with at least one secondary measurement device, the main measurement device comprising:
   a reference signal output port configured to couple to the at least one secondary measurement device;
   a reference signal generator coupled to the reference signal output port and configured to generate a reference signal;
   a measurement port configured to receive a signal to be measured;
   a trigger output port configured to couple to a trigger input port of the at least one secondary measurement device and to output a trigger signal; and
   a controllably switchable internal signal path configured to selectively couple the reference signal generator internally with the measurement port.

2. The main measurement device according to claim 1, further comprising:
   a device controller coupled to the reference signal generator and the switchable internal signal path, wherein the device controller is configured to perform in a calibration operation mode a calibration of the synchronization between the main measurement device and the at least one secondary measurement device by:
      controlling the reference signal generator to output the reference signal via the reference signal output port to the at least one secondary measurement device;

controlling the switchable internal signal path to couple the reference signal generator with the measurement port;

controlling the measurement port to measure the reference signal provided by the reference signal generator via the switchable internal signal path; and generating a main timestamp for the measured reference signal and outputting a trigger signal via the trigger output port at the same time.

3. The main measurement device according to claim 2, further comprising:

a communication interface for communicating with the at least one secondary measurement device, wherein the device controller in the calibration operation mode is further configured:

to receive via the communication interface the reference signal as measured by the at least one secondary measurement device together with a secondary timestamp generated by the at least one secondary measurement device upon receipt of the trigger signal;

to calculate a coarse timing variation between the main measurement device and the at least one secondary measurement device based on the difference between the secondary timestamp and the main timestamp;

to calculate a granular timing variation between the main measurement device and the at least one secondary measurement device based on a phase difference between a phase of the reference signal as measured by the measurement port at the main timestamp and as measured by the at least one secondary measurement device at the secondary timestamp; and to calculate a skew time as a sum of the coarse timing variation and the granular timing variation.

4. The main measurement device according to claim 3, wherein the device controller is configured to further calculate the skew time based on at least one of a cable runtime of a cable used to couple the reference output port to the at least one secondary measurement device or internal signal runtimes of the main measurement device.

5. The main measurement device according to claim 3, further comprising:

a communication interface for communicating with the at least one secondary measurement device, wherein the device controller is further configured to transmit the reference signal as measured by the measurement port with the main timestamp via the communication interface to the at least one secondary measurement device, and to receive the skew time via the communication interface from the at least one secondary measurement device.

6. The main measurement device according to claim 3, wherein the device controller is configured to synchronize measurement data in a measurement operation mode by:

controlling the measurement port to measure an external signal to be measured;

generating, upon occurrence of a trigger condition in the external signal, the main timestamp and the trigger signal, and outputting the trigger signal via the trigger output port of the main measurement device; and receiving, via the communication interface, measurement data from the at least one secondary measurement device, the measurement data including a secondary measurement timestamp, and timely shifting the received measurement data based on the secondary measurement timestamp and the skew time, or providing the main timestamp via the communication interface to the at least one secondary measurement device.

7. A secondary measurement device for simultaneously measuring signals with a main measurement device, the secondary measurement device comprising:

a reference signal input port configured to couple to a reference signal output port of the main measurement device;

a measurement port configured to receive a signal to be measured;

a trigger input port configured to receive an external trigger signal from the main measurement device; and a controllably switchable internal signal path configured to selectively couple the reference signal input port internally with the measurement port.

8. The secondary measurement device according to claim 7, further comprising:

a device controller coupled to the switchable internal signal path, wherein the device controller is configured to perform in a calibration operation mode a calibration of the synchronization between the main measurement device and the secondary measurement device by:

controlling the switchable internal signal path to couple the reference signal input port with the measurement port;

controlling the measurement port to measure a reference signal provided by the reference signal input port via the switchable internal signal path; and generating a secondary timestamp for the measured reference signal upon receipt of a trigger signal via the trigger input port.

9. The secondary measurement device according to claim 8, further comprising:

a communication interface for communicating with the main measurement device, wherein in the calibration operation mode the device controller is further configured:

to receive via the communication interface the reference signal as measured by the main measurement device together with a main timestamp generated by the main measurement device upon generation of the trigger signal, to calculate a coarse timing variation between the main measurement device and the secondary measurement device based on the difference between the main timestamp and the secondary timestamp, to calculate a granular timing variation between the main measurement device and the secondary measurement device based on a phase difference between a phase of the reference signal as measured by the measurement port at the secondary timestamp and as measured by the main measurement device at the main timestamp, and to calculate a skew time as a sum of the coarse timing variation and the granular timing variation.

10. The secondary measurement device according to claim 9, wherein in the calibration operation mode the device controller is configured to further calculate the skew time based on at least one of a cable runtime of a cable used to couple the main measurement device to the reference signal input port or internal signal runtimes of the secondary measurement device.

11. The secondary measurement device according to claim 9, wherein the device controller is configured to synchronize measurement data in a measurement operation mode by:

controlling the measurement port to measure an external signal, generating a measurement timestamp upon reception of the external trigger signal via the trigger input port of the secondary measurement device;

receiving the main timestamp via the communication interface; and timely shifting measurement data of the measured external signal based on the measurement timestamp, the main timestamp, and the skew time.

12. The secondary measurement device according to claim 9, further comprising:

a communication interface for communicating with the main measurement device, wherein the device controller is configured to transmit the reference signal as measured by the measurement port with the secondary timestamp via the communication interface to the main measurement device, and to receive the skew time via the communication interface from the main measurement device.

13. A method for synchronizing simultaneous measurement of signals with a main measurement device and at least one secondary measurement device, the main measurement device comprising a reference signal output port, a first measurement port, a trigger output port, and a first communication interface, and the at least one secondary measurement device comprising a reference signal input port coupled to the reference signal output port, a second measurement port, a trigger input port coupled to the trigger output port, and a second communication interface coupled to the second communication interface of the main measurement device, the method comprising:

outputting a reference signal generated by a reference signal generator in the main measurement device via the reference signal output port of the main measurement device to the reference signal input port of the at least one secondary measurement device;

internally coupling the reference signal generator with the first measurement port of the main measurement device;

internally coupling the reference signal input port of the at least one secondary measurement device with the second measurement port of the at least one secondary measurement device;

measuring the reference signal with the first measurement port of the main measurement device;

measuring the reference signal with the second measurement port of the at least one secondary measurement device;

generating a main timestamp for the measured reference signal in the main measurement device;

outputting a trigger signal via the trigger output port of the main measurement device concurrently with generating the main timestamp;

generating a secondary timestamp for the measured reference signal in the at least one secondary measurement device upon receipt of the trigger signal; and determining a skew time based on data measured in the main measurement device and the main timestamp and the data measured in the at least one secondary measurement device and the respective secondary timestamp.

14. The method of claim 13, wherein determining the skew time comprises at least one of:

receiving in the main measurement device via the first communication interface the reference signal as measured by the at least one secondary measurement device together with the secondary timestamp generated by the at least one secondary measurement device upon receipt of the trigger signal, calculating a first coarse timing variation between the main measurement device and the at least one secondary measurement device based on the difference between the secondary timestamp and the main timestamp, calculating a first granular timing variation between the main measurement device and the at least one secondary measurement device based on a phase difference between a phase of the reference signal as measured by the first measurement port of the main measurement device at the main timestamp and as measured by the second measurement port the at least one secondary measurement device at the secondary timestamp, and calculating the skew time as a sum of the first coarse timing variation and the first granular timing variation; or wherein determining the skew time comprises:

receiving in the secondary measurement device via the second communication interface the reference signal as measured by the main measurement device together with the main timestamp generated by the main measurement device upon generation of the trigger signal, calculating a second coarse timing variation between the main measurement device and the secondary measurement device based on the difference between the main timestamp and the secondary timestamp, calculating a second granular timing variation between the main measurement device and the secondary measurement device based on the phase difference between the phase of the reference signal as measured by the measurement port of the at least one secondary measurement device at the secondary timestamp and as measured by the measurement port of the main measurement device at the main timestamp, and calculating the skew time as the sum of the second coarse timing variation and the second granular timing variation.

15. The method of claim 14, wherein determining the skew time comprises:

additionally determining the skew time based on at least one of (i) a cable runtime of a cable used to couple the main measurement device to the at least one secondary measurement device or (ii) internal signal runtimes of at least one of the main measurement device or the secondary measurement device.

16. The method of claim 14, further comprising:

synchronizing measurement data by:

measuring a first external signal to be measured in the main measurement device, measuring a second external signal to be measured in the at least one secondary measurement device, generating, in the main measurement device upon occurrence of a trigger condition in the first external signal, the main timestamp and the trigger signal, outputting the trigger signal to the at least one secondary measurement device concurrently with generating the main timestamp, and timely shifting measurement data of the measured second external signal based on the main timestamp and the secondary timestamp and the skew time by at least one of:

receiving, in the main measurement device, measurement data from the at least one secondary measurement device including the secondary timestamp, and in the main measurement device shifting the received measurement data based on the secondary measurement timestamp and the skew time; or providing the main timestamp via the first communication interface to the at least one secondary measurement device, and in the at least one secondary measurement device shifting measurement data of the measured second external signal based on the secondary timestamp, the main timestamp, and the skew time.

* * * * *